(12) United States Patent
Chen et al.

(10) Patent No.: US 12,087,841 B2
(45) Date of Patent: Sep. 10, 2024

(54) METHOD OF MANUFACTURING GATE SPACERS WITH STEPPED SIDEWALLS BY REMOVING VERTICAL PORTIONS OF A HELMET LAYER

(71) Applicant: TAIWAN SEMICONDUCTOR MANUFACTURING CO., LTD., Hsinchu (TW)

(72) Inventors: Yi-Lun Chen, Taichung (TW); Bau-Ming Wang, Kaohsiung (TW); Chun-Hsiung Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 150 days.

(21) Appl. No.: 17/850,850

(22) Filed: Jun. 27, 2022

(65) Prior Publication Data
US 2022/0352345 A1 Nov. 3, 2022

Related U.S. Application Data

(60) Continuation of application No. 16/988,608, filed on Aug. 8, 2020, now Pat. No. 11,374,108, which is a
(Continued)

(51) Int. Cl.
*H01L 29/66* (2006.01)
*H01L 21/02* (2006.01)
(Continued)

(52) U.S. Cl.
CPC .... *H01L 29/6653* (2013.01); *H01L 21/02532* (2013.01); *H01L 21/0257* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,390,981 B1 7/2016 Basker
9,508,604 B1 11/2016 Sung
(Continued)

*Primary Examiner* — Younes Boulghassoul
(74) *Attorney, Agent, or Firm* — Maschoff Brennan

(57) ABSTRACT

A method includes forming a semiconductor fin over a substrate; forming a gate structure over the semiconductor fin; forming a helmet layer lining the gate structure and the semiconductor fin; etching the helmet layer to remove portions of the helmet layer from opposite sidewalls of the gate structure, wherein the remaining helmet layer comprises a first remaining portion on a top surface of the gate structure and a second remaining portion on a top surface of the semiconductor fin; forming a spacer layer covering the gate structure, wherein the spacer layer is in contact with the first remaining portion and the second remaining portion of the remaining helmet layer; etching the spacer layer and the remaining helmet layer to form gate spacers, wherein each of the gate spacers has a stepped sidewall; and forming source/drain epitaxy structures on opposite sides of the gate structure.

20 Claims, 18 Drawing Sheets

Related U.S. Application Data division of application No. 15/907,214, filed on Feb. 27, 2018, now Pat. No. 10,741,667.

(51) Int. Cl.
*H01L 21/306* (2006.01)
*H01L 21/311* (2006.01)
*H01L 21/3115* (2006.01)
*H01L 21/768* (2006.01)
*H01L 21/8234* (2006.01)
*H01L 29/78* (2006.01)

(52) U.S. Cl.
CPC .. *H01L 21/02592* (2013.01); *H01L 21/30604* (2013.01); *H01L 21/31144* (2013.01); *H01L 21/31155* (2013.01); *H01L 21/823431* (2013.01); *H01L 21/823468* (2013.01); *H01L 29/66545* (2013.01); *H01L 29/6656* (2013.01); *H01L 29/66795* (2013.01); *H01L 29/785* (2013.01); *H01L 21/76834* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823468; H01L 21/823864; H01L 29/6656; H01L 29/6653; H01L 21/3115–31155; H01L 21/31105–31122; H01L 21/02323; H01L 21/0257; H01L 21/02592; H01L 21/31144; H01L 21/823418; H01L 21/823814; H01L 21/823425; H01L 29/0847; H01L 29/7848; H01L 29/66636; H01L 29/66575; H01L 29/42376; H01L 29/42384; H01L 29/66545; H01L 21/28114; H01L 21/823437; H01L 21/823828; H01L 21/823456; H01L 21/82385

See application file for complete search history.

(56) References Cited

U.S. PATENT DOCUMENTS

| | | | |
|---|---|---|---|
| 9,577,066 B1* | 2/2017 | Al-Amoody | H01L 21/31111 |
| 9,634,002 B1 | 4/2017 | Tsai | |
| 9,640,661 B1 | 5/2017 | Lee | |
| 9,716,096 B1* | 7/2017 | Ching | H01L 21/02126 |
| 2012/0273848 A1 | 11/2012 | Fan | |
| 2013/0072023 A1* | 3/2013 | Zhu | H01L 21/823431 |
| | | | 257/E21.232 |
| 2015/0263138 A1 | 9/2015 | Kim | |
| 2016/0042952 A1 | 2/2016 | Tsai | |
| 2016/0163546 A1* | 6/2016 | Godet | H01L 21/0332 |
| | | | 257/623 |
| 2016/0380074 A1 | 12/2016 | Cheng | |
| 2017/0005005 A1 | 1/2017 | Chen | |
| 2017/0084493 A1 | 3/2017 | Han | |
| 2017/0098711 A1 | 4/2017 | Hsiao | |
| 2017/0110476 A1* | 4/2017 | Ching | H01L 27/11807 |
| 2017/0221893 A1 | 8/2017 | Tak | |
| 2017/0323954 A1 | 11/2017 | Tsai | |
| 2018/0254331 A1* | 9/2018 | Xie | H01L 29/66795 |
| 2018/0337280 A1 | 11/2018 | Zhao | |
| 2019/0164843 A1* | 5/2019 | Cheng | H01L 27/0886 |
| 2019/0198636 A1 | 6/2019 | Noh | |
| 2019/0304840 A1* | 10/2019 | Lee | H01L 21/28088 |

* cited by examiner

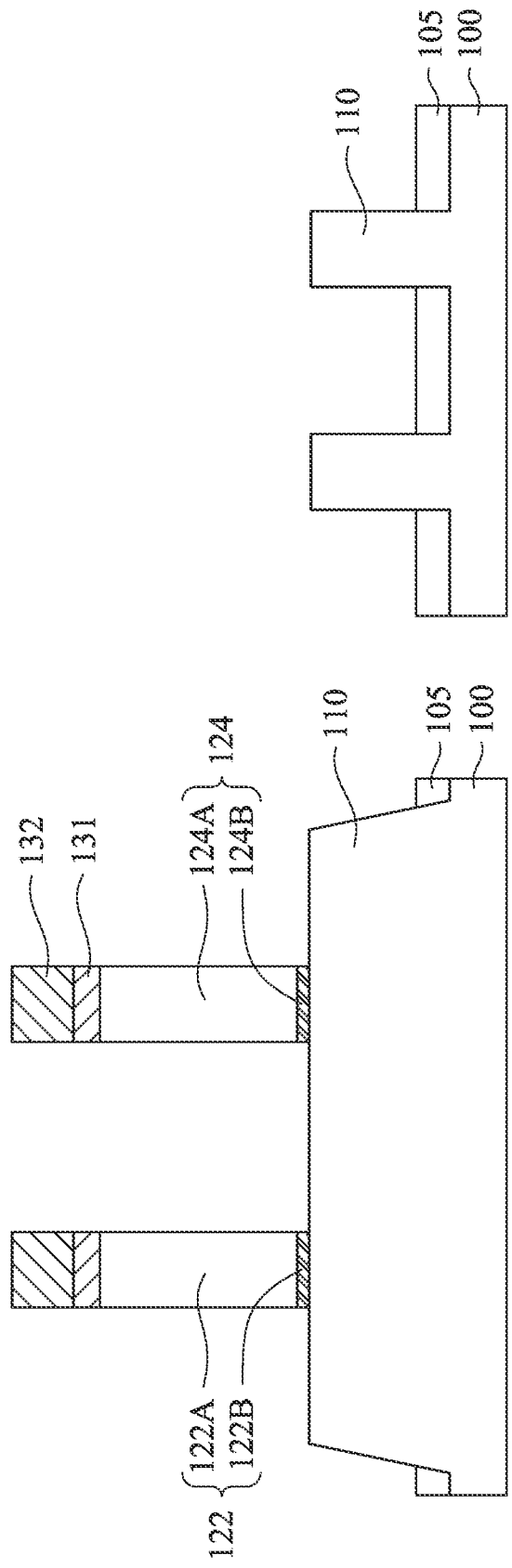

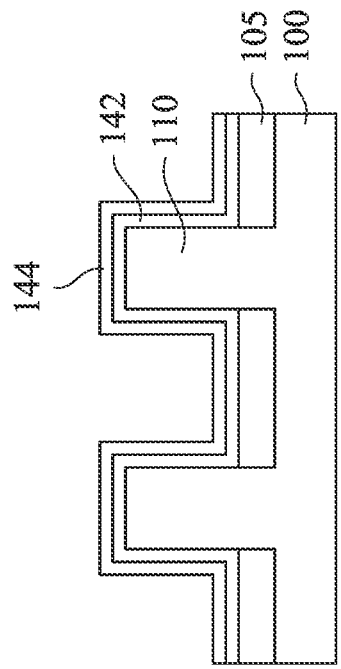
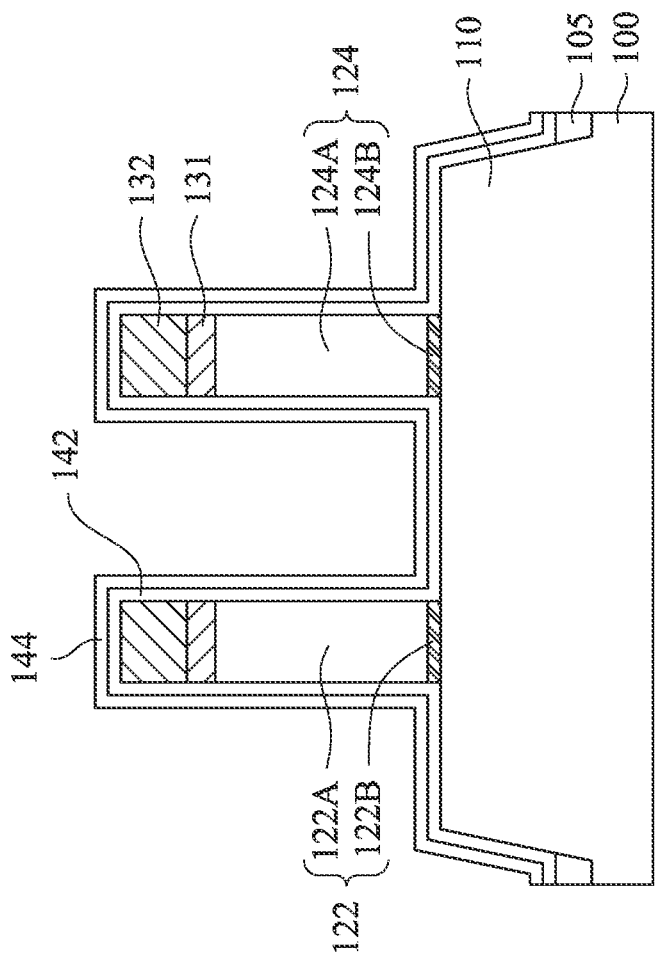
Fig. 4A
Fig. 4B

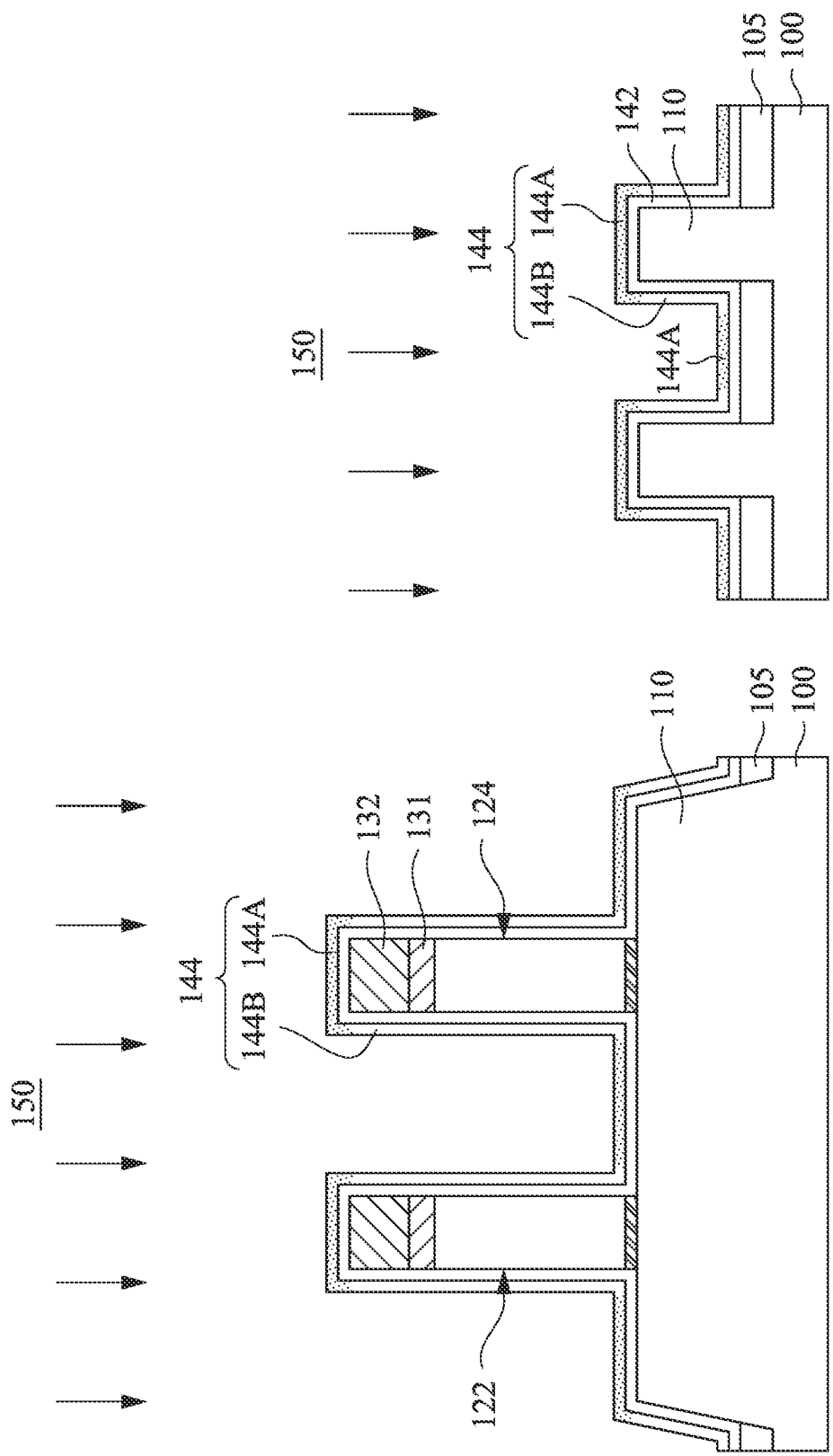

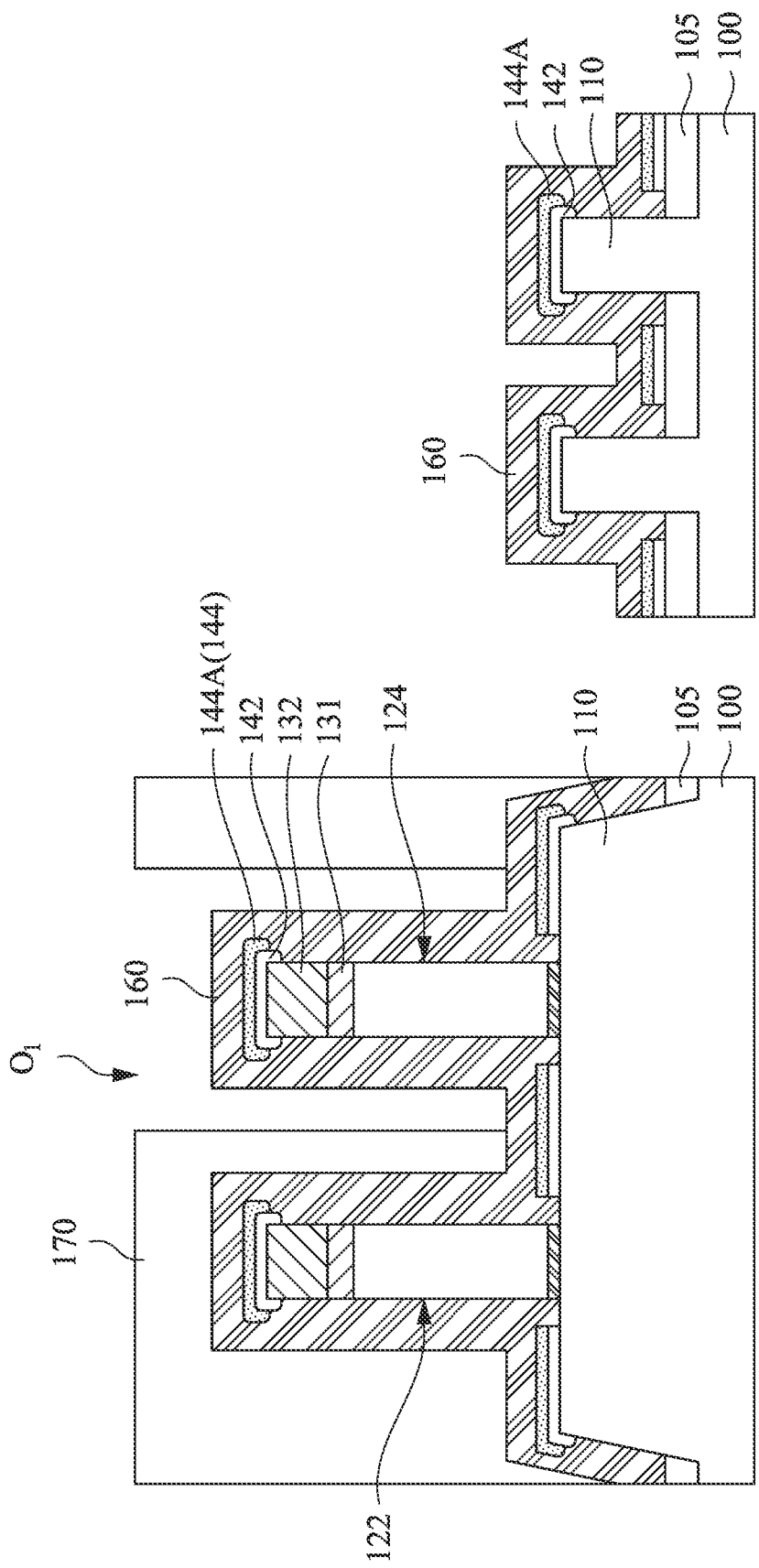

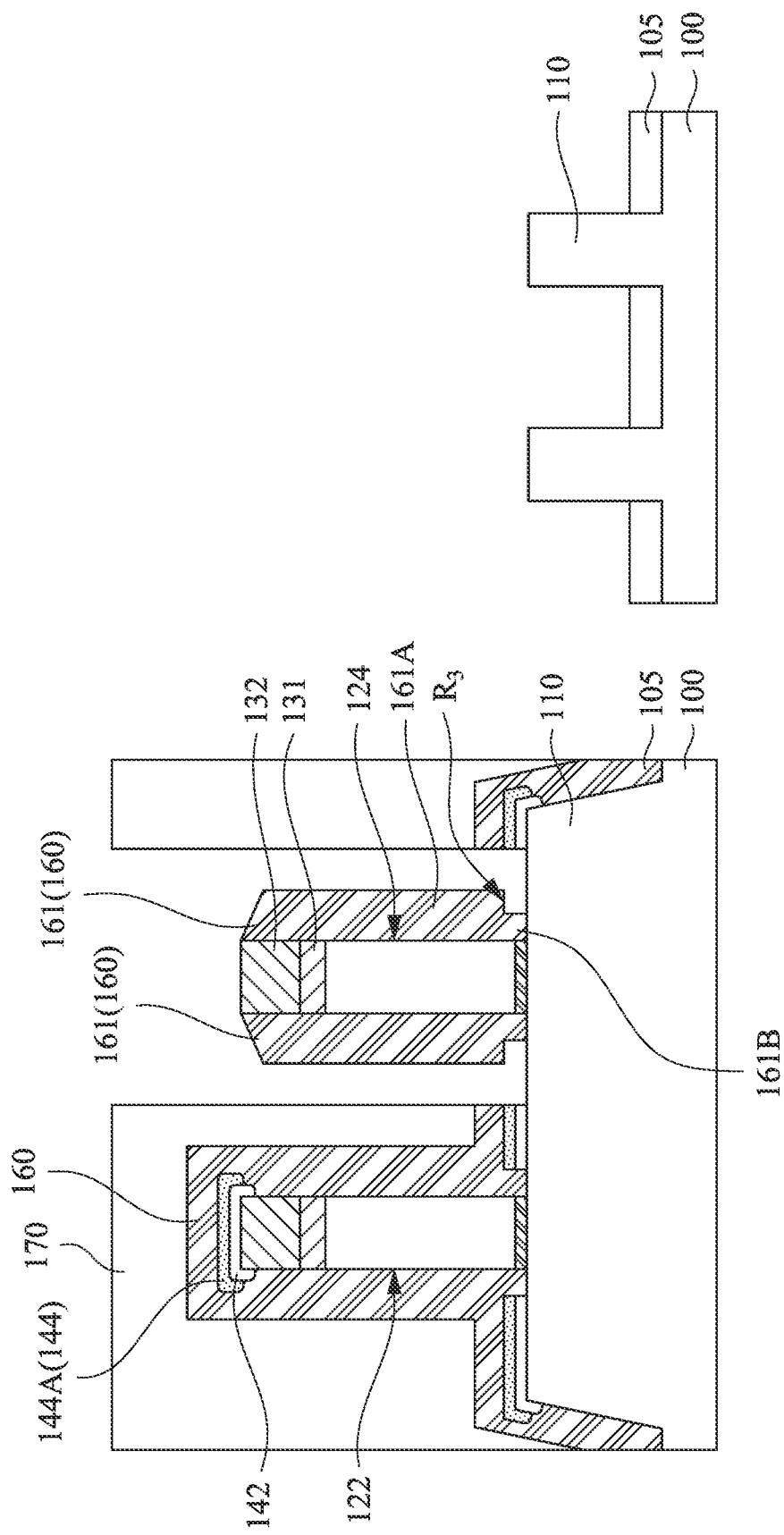

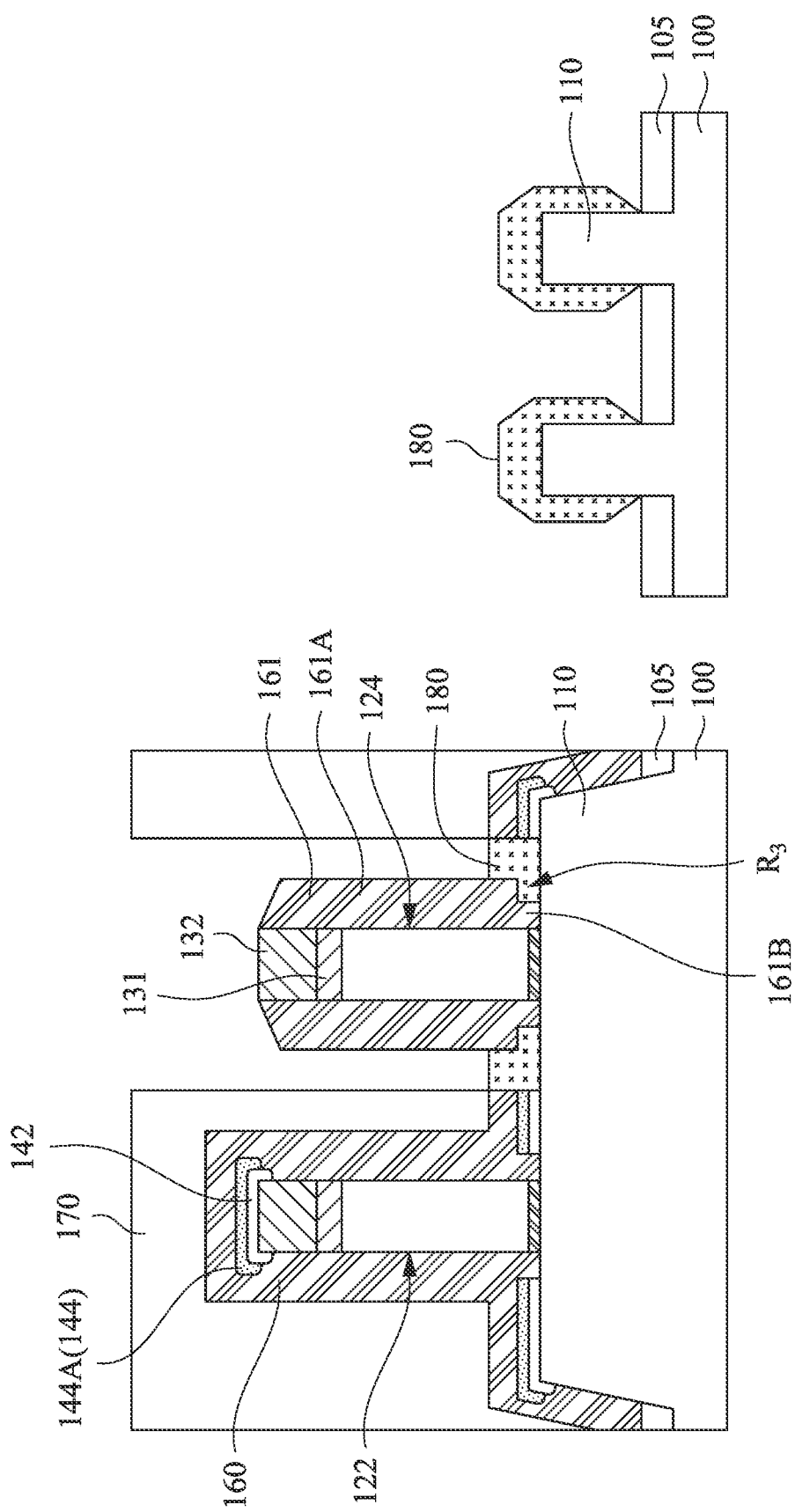

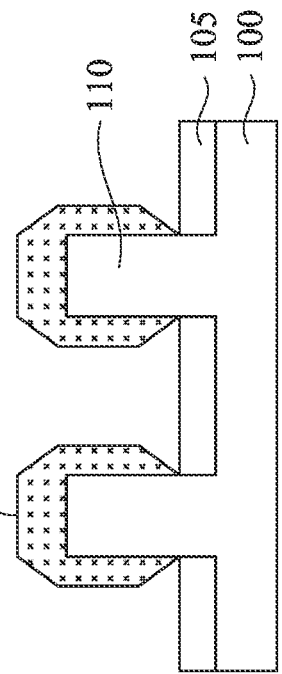
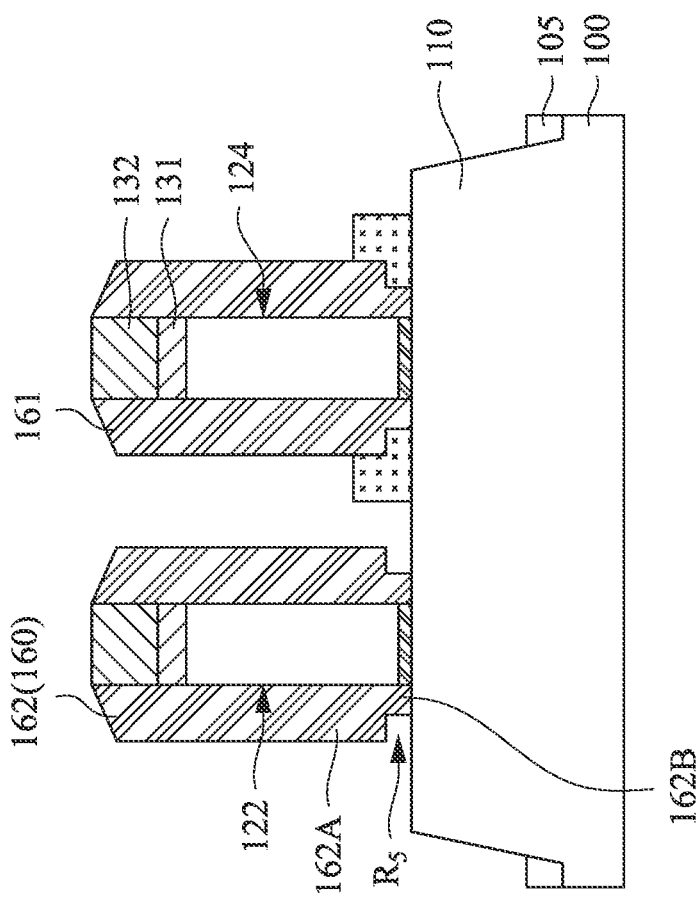
Fig. 12A
Fig. 12B

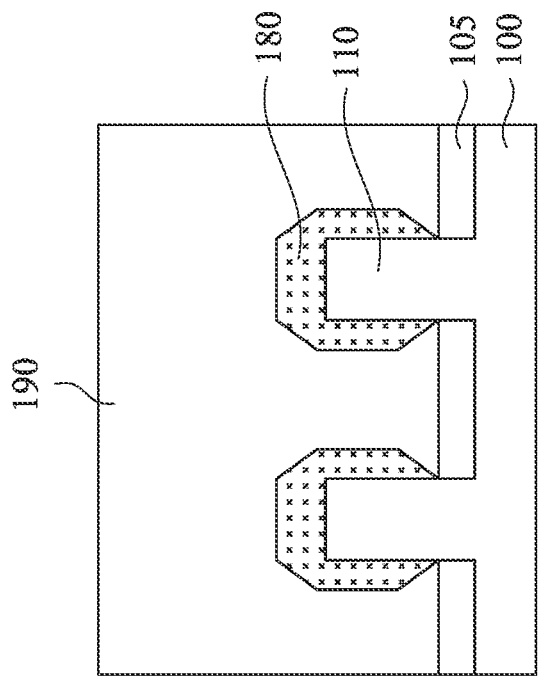
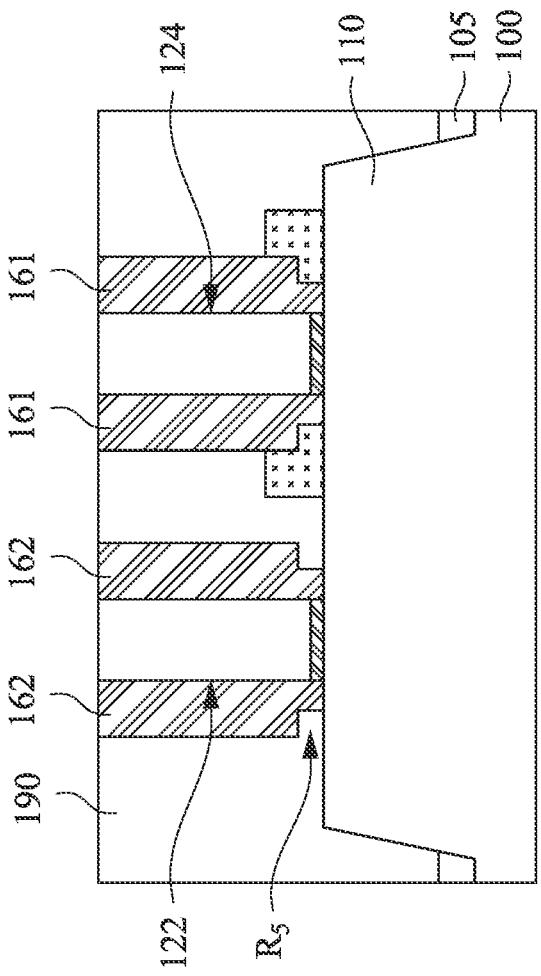
Fig. 13A
Fig. 13B

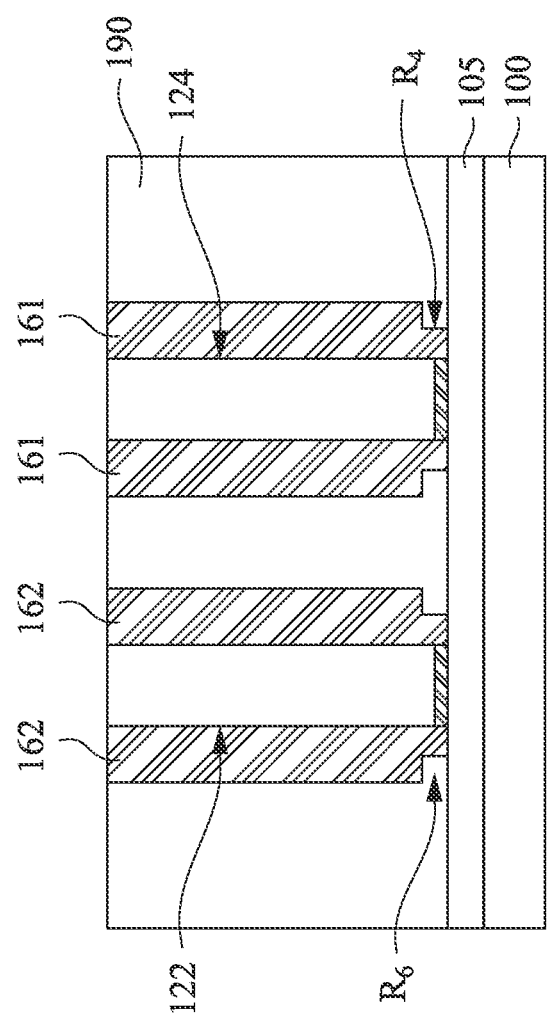

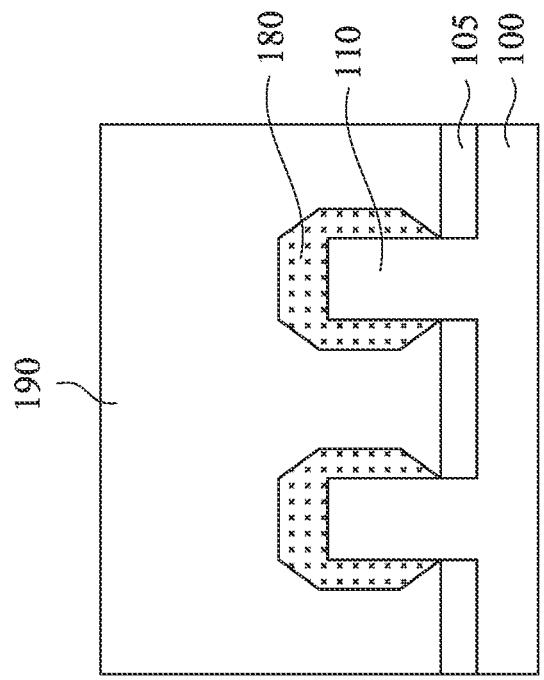
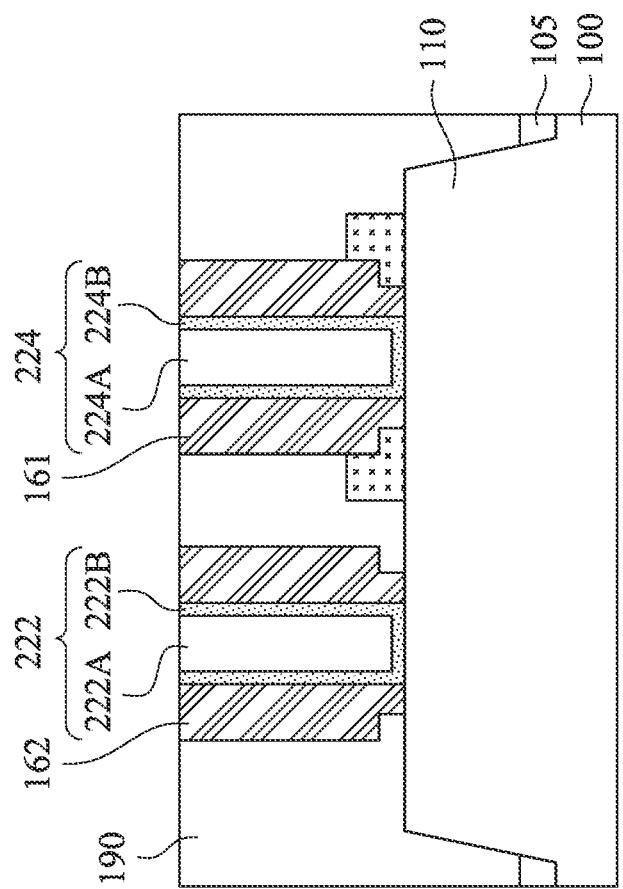
Fig. 14A
Fig. 14B

METHOD OF MANUFACTURING GATE SPACERS WITH STEPPED SIDEWALLS BY REMOVING VERTICAL PORTIONS OF A HELMET LAYER

PRIORITY CLAIM AND CROSS-REFERENCE

The present application is a Continuation application of U.S. application Ser. No. 16/988,608, filed on Aug. 8, 2020, now U.S. Pat. No. 11,374,108, issued on Jun. 28, 2022, which is a Divisional application of U.S. application Ser. No. 15/907,214, filed on Feb. 27, 2018, now U.S. Pat. No. 10,741,667, issued on Aug. 11, 2020, which are herein incorporated by references.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-14C illustrate a method of manufacturing a semiconductor device at various stages in accordance with some embodiments.

DETAILED DESCRIPTION

Figure 1:
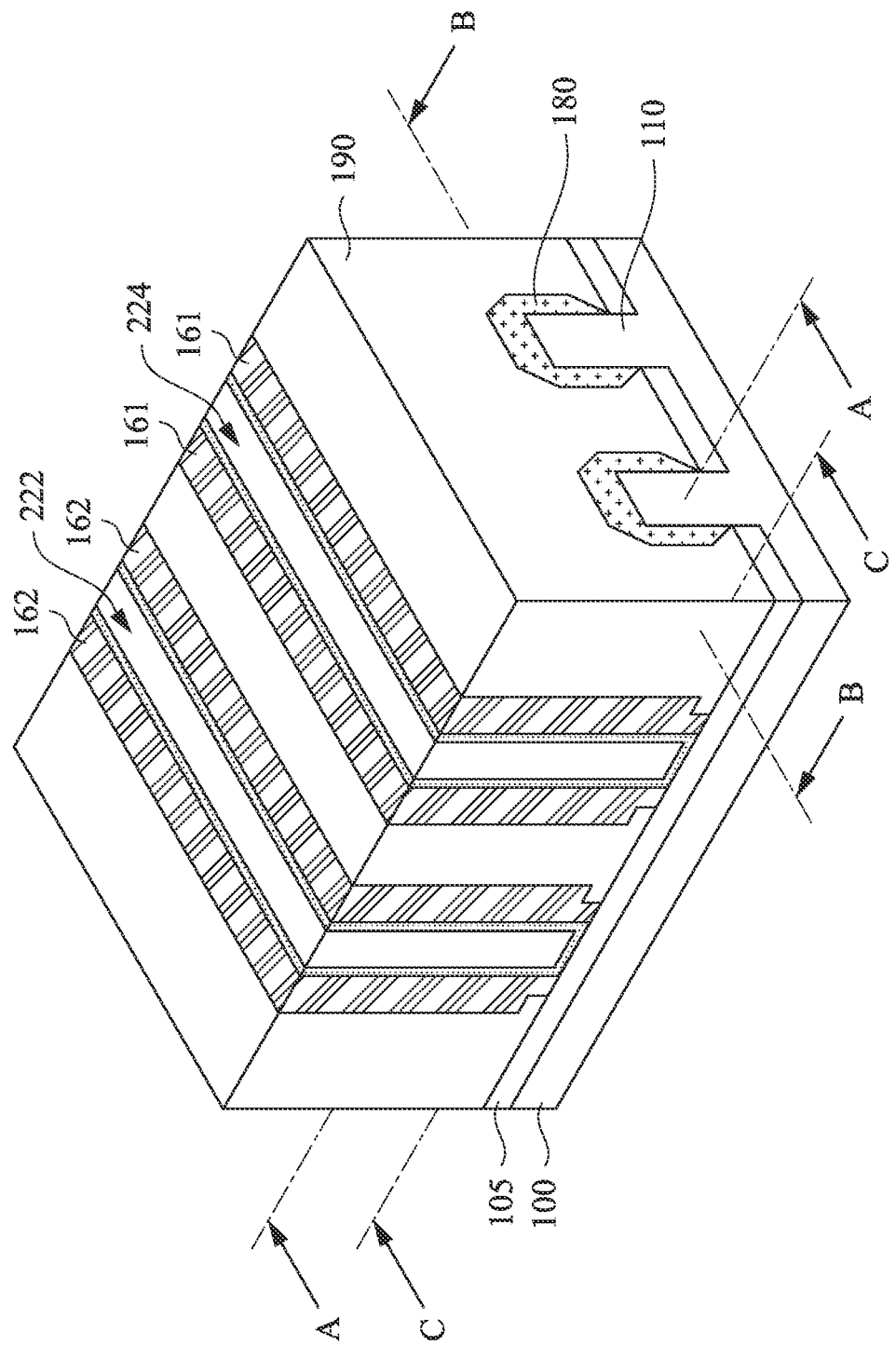
FIG. 1 is a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a schematic view of a semiconductor device in accordance with some embodiments.

A semiconductor device includes a substrate 100 having a plurality of semiconductor fins 110. Isolation structures 105 are disposed on the substrate 100 and adjacent to the semiconductor fins 110. Gate stacks 222 and 224 are disposed over the substrate 100 and cross the semiconductor fins 110. A plurality of gate spacers 161 and 162 are disposed respectively on opposite sidewalls of the gate stacks 222 and 224. Source/drain structures 180 are disposed on the semiconductor fins 110. An interlayer dielectric 190 is disposed over the substrate 100. Detail descriptions will be discussed later.

FIGS. 2A-14C illustrate a method of manufacturing a semiconductor device at various stages for forming the semiconductor structure of FIG. 1, in which FIGS. 2A to 14A are cross-sectional views along line A-A of FIG. 1, FIGS. 2B to 14B are cross-sectional views along line A-A of FIG. 1, and FIGS. 9C and 12C to 14C are cross-sectional views along line C-C of FIG. 1. It is understood that additional operations can be provided before, during, and after processes shown in 2A to 14B, and some of the operations described below can be replaced or eliminated, for additional embodiments of the method. The order of the operations/processes may be interchangeable.

Figure 2B:
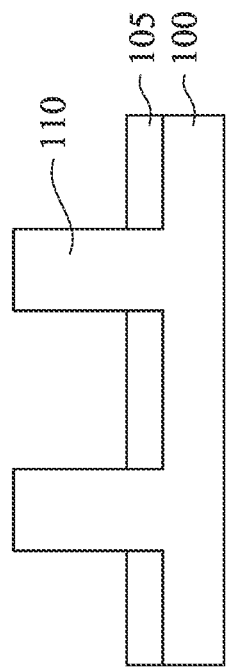
Figure 2A:
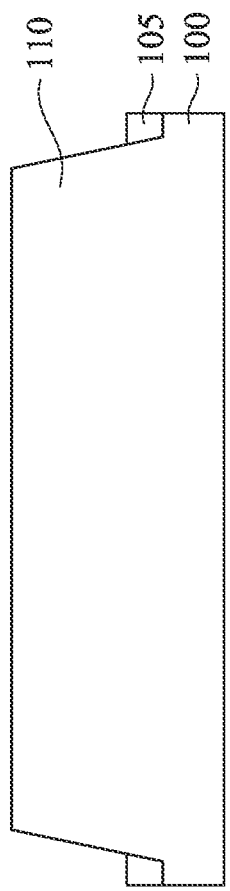

Reference is made to FIGS. 2A and 2B. Semiconductor fins 110 are formed over a substrate 100. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

For example, the fins 110 may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 110 by etching the initial layers. The etching process can include dry etching, wet etching, reactive ion etching (RIE), and/or other suitable processes.

A plurality of isolation structures 105 are formed over the substrate 100 and adjacent to the semiconductor fins 110. The isolation structures 105, which act as a shallow trench isolation (STI) around the semiconductor fins 110 may be formed by chemical vapor deposition (CVD) techniques using tetra-ethyl-ortho-silicate (TEOS) and oxygen as a precursor. In yet some other embodiments, the isolation structures 105 are insulator layers of a SOI wafer.

Reference is made to FIGS. 3A and 3B. Dummy gate stacks 122 and 124 are formed over the semiconductor fins 110 of the substrate 100. The dummy gate stacks 122 and 124 may be formed by, for example, depositing a dummy gate layer over the semiconductor fins 110 of the substrate 100. A patterned first mask 131 and a patterned second mask 132 are deposited sequentially over the dummy gate layer to define the position of the dummy gate stacks 122 and 124. An etching process is then performed to pattern the dummy gate layer to form the dummy gate stacks 122 and 124.

In some embodiments, the dummy gate layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric until the semiconductor fins 110 is exposed.

The first mask 131 and the second mask 132, which are used as a hard mask layer during etching later, may include silicon oxide, silicon nitride and/or silicon oxynitride. The material of the first mask 131 may be different from that of the second mask 132. For example, the first mask 131 made from silicon nitride may be located below or above the second mask 132 made from oxide. The first mask 131 and the second mask 132, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

In some embodiments, the dummy gate stack 122 includes a dummy gate 122A and a gate dielectric 122B underlying the dummy gate 122A, and the dummy gate stack 124 includes a dummy gate 124A and a gate dielectric 124B underlying the dummy gate 124A. The dummy gates 122A and 124A may include polycrystalline-silicon (poly-Si) or poly-crystalline silicon-germanium (poly-SiGe) and may be formed by suitable deposition processes such as low-pressure chemical vapor deposition (LPCVD) and plasma-enhanced CVD (PECVD). Further, the dummy gates 122A and 124A may be doped poly-silicon with uniform or non-uniform doping. In some embodiments, the gate dielectrics 122B and 124B may include a dielectric material such as silicon oxide layer (e.g., $SiO_2$) or silicon oxynitride (e.g., SiON), and may be formed by chemical oxidation, thermal oxidation, atomic layer deposition (ALD), chemical vapor deposition (CVD), and/or other suitable methods. In other embodiments, the gate dielectrics 122B and 124B may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

Reference is made to FIGS. 4A and 4B. A first helmet layer 142 and a second helmet layer 144 are formed over the substrate 100 and blanket the dummy gate stacks 122 and 124 and the semiconductor fins 110. In FIG. 4A, the first helmet layer 142 and a second helmet layer 144 cover and are conformal to the second mask 132, the first mask 131, and the dummy gate stacks 122 and 124. On the other hand, in FIG. 4B, the first helmet layer 142 and a second helmet layer 144 cover and are conformal to the semiconductor fins 110 and the isolation structures 105. The first helmet layer 142 and a second helmet layer 144 may be formed by suitable deposition process, such CVD, PVD, and/or ALD.

In some embodiments, the first helmet layer 142 is a metal containing layer. For example, the first helmet layer 142 may be made of metal, metal oxide, or combination thereof. For example, metal may be TiN, TaN, WC, or other suitable metals. Metal oxide may be $Al_2O_3$, $HfO_2$, $ZrO_2$, $TiO_2$, $Ga_2O_3$, or other suitable metal oxides. The thickness of the first helmet layer 142 may be in a range from about 2 nm to about 5 nm.

In some embodiments, the second helmet layer 144 is made of amorphous silicon (a-Si). The thickness of the second helmet layer 144 may be in a range from about 2 nm to about 5 nm.

Reference is made to FIGS. 5A and 5B. An implantation process 150 is performed to the second helmet layer 144 so as to change the etching properties of different portions of the second helmet layer 144. In some embodiments where the second helmet layer 144 is an a-Si layer, the dopant of the implantation process 150 may include boron (B), carbon (C), oxygen (O), which will improve the etch resistance of the second helmet layer 144 to an etchant used in a spacer etching process performed in a later stage, as illustrated in FIGS. 8A-9A and/or FIGS. 12A-12C. The implantation process 150 involves ion implantation, with implantation energy in a range from about 0.5 keV to about 2.5 keV, a dose in a range from about $10^{14}$ cm$^{-2}$ to about $5 \times 10^{14}$ cm$^{-2}$, and an implantation angle between about 0° to about 6°.

During the implantation process 150, the implantation angle is controlled in such a way that the horizontal portions of the second helmet layer 144 are doped, while the vertical portions of the second helmet layer 144 remain substantially un-doped or not intentionally doped. As a result, the implantation process 150 results in a plurality of doped horizontal portions 144A and un-doped vertical portions 144B formed in the second helmet layer 144, which in turn will result in different etch selectivities between the horizontal portions 144A and the vertical portions 144B. In some embodiments, the doped portions 144A extend in parallel with top surfaces of the dummy gate stacks 122 and 124, the semiconductor fins 110, and the isolation structures 105. Further, the un-doped portions 144B extend in parallel with sidewalls of the dummy gate stacks 122 and 124 and the semiconductor fins 110.

Figure 6B:
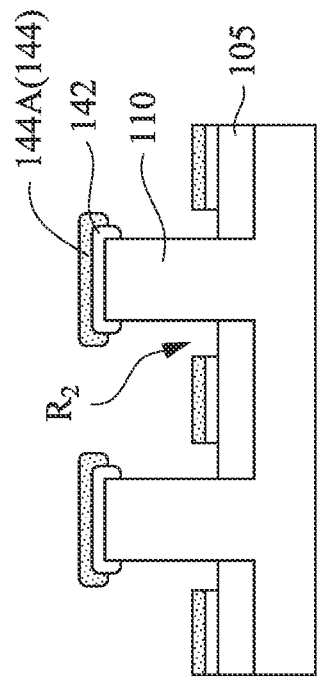
Figure 6A:
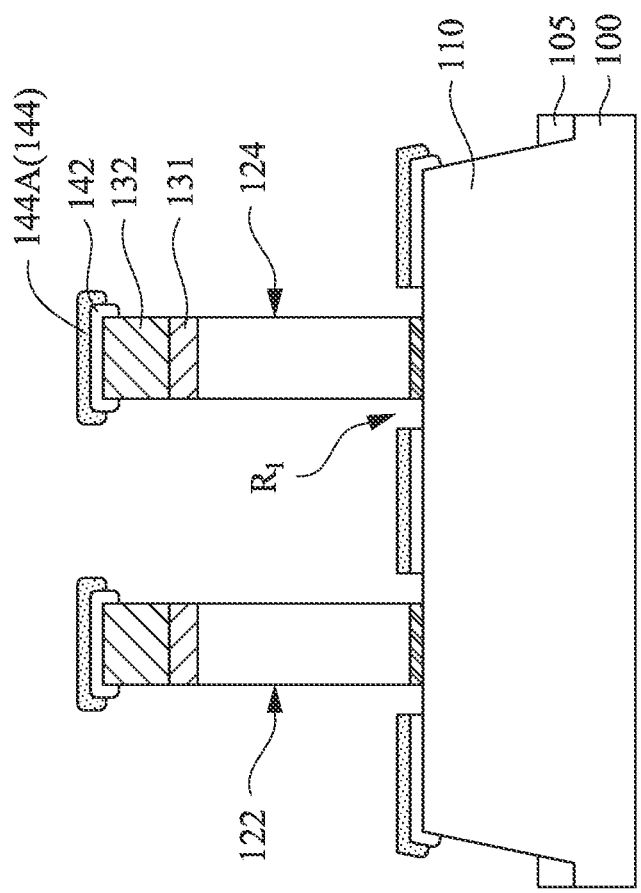

Reference is made to FIGS. 6A and 6B. An etching process is performed to remove portions of the first helmet layer 142 and the second helmet layer 144. During the etching process, since the doped portions 144A and the un-doped portions 144B (referring to FIGS. 5A and 5B) of the second helmet layer 144 have different etch selectivities, the etchant used in the etching process is selected to selectively remove the un-doped vertical portions 144B while keep the doped horizontal portions 144A and the underlying portions of the first helmet layer 142 substantially intact. For example, the doped portions 144A have higher etch resistance to the etchant used in the etching process than that of the un-doped portions 144B and of the first helmet layer 142. In greater detail, the doped a-Si portions 144A have higher etch resistance to the etchant used in the etching process than that of un-doped a-Si portions 144B and of metal-containing layer 142. In this way, the etching process removes un-doped vertical a-Si portions 144B and vertical portions of the metal-containing layer 142 alongside the un-doped vertical a-Si portions 144B, while remaining doped horizontal a-Si portions 144A and the underlying horizontal portions of the metal-containing layer 142 over the substrate 100. The etching process may include, for example, wet etching. However, other suitable process, such as dry etching or a combination of dry etching and wet etching, may be used as well. An example etchant used to achieve such a selective etching process includes, for example, DHF, NH$_4$OH or other suitable solution.

Accordingly, the remaining first helmet layer 142 and the remaining second helmet layer 144 cover the underlying dummy gate stacks 122 and 124, the semiconductor fins 110 and isolation structures 105. The remaining first helmet layer 142 and the remaining second helmet layer 144 collectively act as masks to protect the underlying materials (e.g., materials of dummy gate stacks, fins and STI) from a subsequent etching process.

Stated another way, the remaining second helmet layer 144 and the underlying first helmet layer 142 cover the top surfaces of the second mask 132 and the semiconductor fins 110, and leave the sidewalls of the dummy gate stacks 122 and 124 and the semiconductor fins 110 uncovered. In some embodiments, the sidewalls of the semiconductor fins 110 are partially covered by the remaining first helmet layer 142 and the remaining second helmet layer 144, as shown in FIG. 6B.

After the etching process, a plurality of gaps R$_1$ are formed adjacent to x formed adjacent to opposite sidewalls of the semiconductor fins 110. As illustrated, the gap R$_1$ is formed between the sidewall of the dummy gate stack 122 (or 124) and the doped horizontal a-Si portion 144A on the semiconductor fin 110, and the gap R$_2$ is formed between the sidewall of the semiconductor fin 110 and the doped horizontal a-Si portion 144A on the STI 105. As illustrated in FIG. 6A, portions of the top surface of the semiconductor fin 110 are exposed through the respective recesses R$_1$. As illustrated in FIG. 6B, portions of the top surface of the isolation structures 105 are exposed through the respective recesses R$_2$.

Figure 7B:
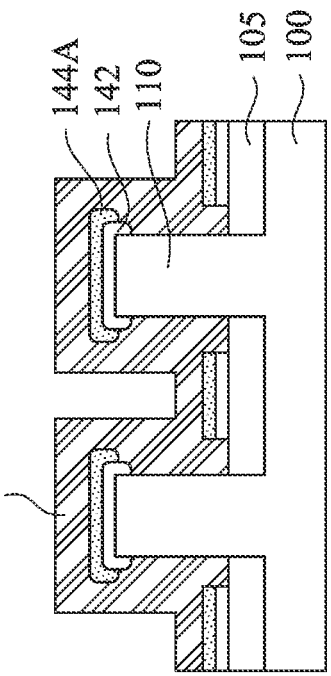
Figure 7A:
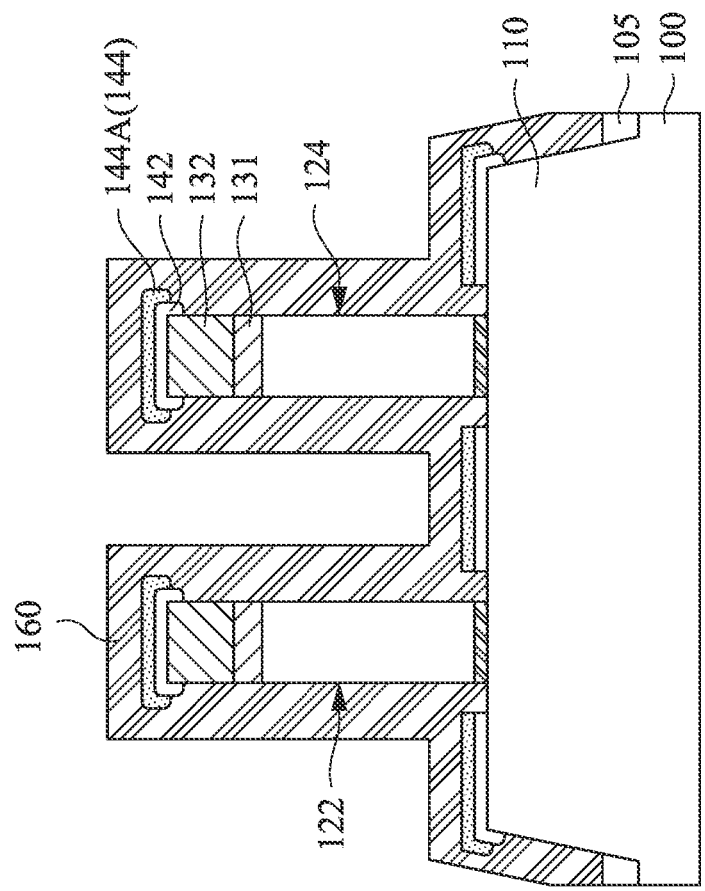

Reference is made to FIGS. 7A and 7B. A spacer layer 160 is formed blanket over the substrate 100 to cover the dummy gate stacks 122 and 124, the semiconductor fins 110 and the isolation structures 105. In greater detail, the spacer layer 160 covers the top surfaces of the remaining second helmet layer 144, sidewalls of the dummy gate stacks 122 and 124, and sidewalls of the semiconductor fins 110. In some embodiments, the spacer layer 160 fills the gaps R$_1$ and R$_2$.

In some embodiments, the spacer layer 160 includes single or multiple layers. The spacer layer 160 can be formed by blanket depositing one or more dielectric layer(s) on the previously formed structure. The spacer layer 160 may include silicon nitride (SiN), oxynitride, silicon carbon (SiC), silicon oxynitride (SiON), oxide, and the like and may be formed by methods utilized to form such a layer, such as CVD, plasma enhanced CVD, sputter, the like, or combinations thereof.

Reference is made to FIGS. 8A and 8B. A patterned mask 170 is formed over the substrate 100 and partially covers of the spacer layer 160. In some embodiments, the patterned mask 170 substantially covers a portion of the spacer layer 160 above dummy gate stack 122, and the patterned mask 170 includes an opening O1 that exposes another portion of the spacer layer 160 above dummy gate stack 124 and its surrounding regions. In some embodiments, the patterned mask 170 may be a photoresist layer.

Figure 9C:
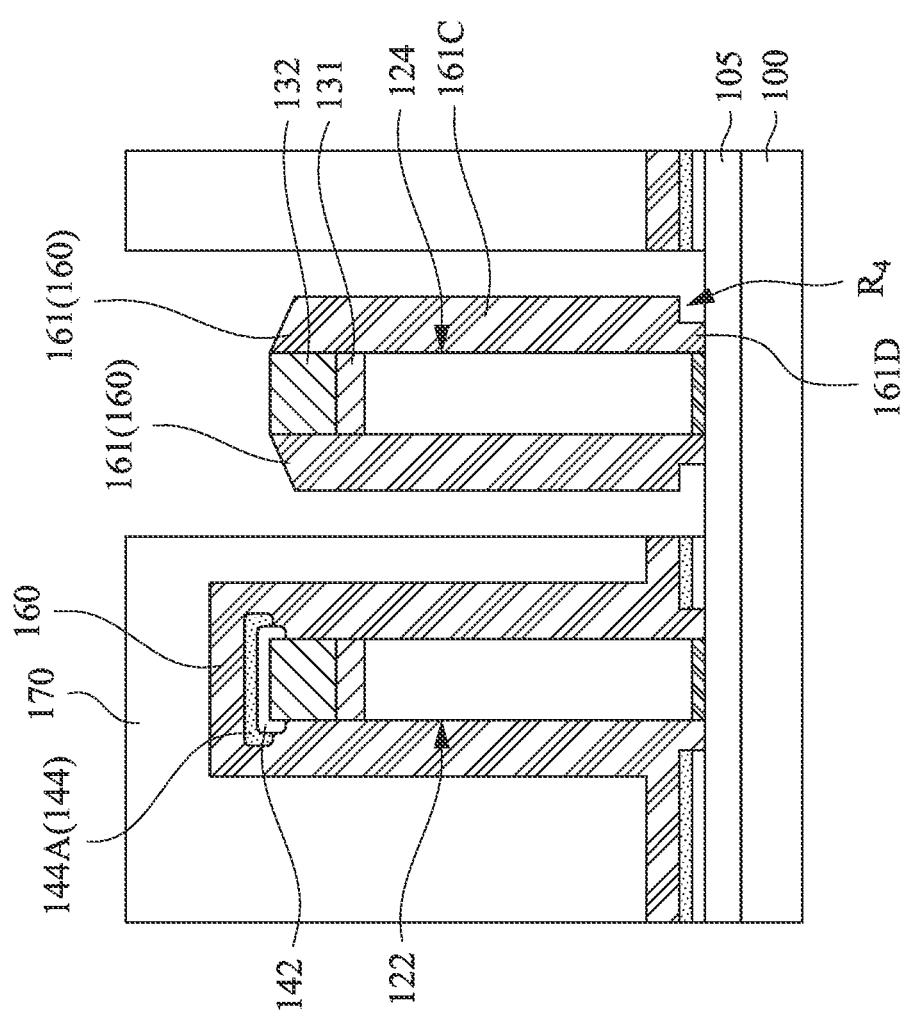

Reference is made to FIGS. 9A to 9C. An etching process is performed to the spacer layer 160. The etching process may be dry etching, wet etching, or combination thereof. For example, dry etching process, such as plasma etching or other suitable etching, may be employed. In FIG. 9A, during the etching process, portions of the spacer layer 160 remain on opposite sidewalls of the dummy gate stack 124, and may be referred to as gate spacers 161 in some embodiments. The etchant used in the etching process attacks the second and first helmet layers 144 and 142 prior to attacking the masks 131, 132 and/or the dummy gate stack 124, because the masks 131, 132 and/or the dummy gate stack 124 are covered by the helmet layers 144 and 142. In this way, the helmet layers 144 and 142 can delay etching the masks 131, 132 and/or the dummy gate stack 124 until the helmet layers 144 and 142 are removed. As a result, the helmet layers 142 and 144 over the dummy gate stack 124 can prevent the dummy gate stack 124 from unwanted damage caused by etching the spacer layer 160. In a similar fashion, the helmet layers 144 and 142 can delay etching the corresponding underlying fins 110 and the isolation structures 105 until the helmet layers 144 and 142 are removed, which in turn will prevent the fins 110 and the isolation structures 105 from unwanted damage caused by etching the spacer layer 160.

In some embodiments, the doped portion 144A of the helmet layer 144 has higher etch resistance to the etchant used to etch the spacer layer 160 than that of the first mask 131, second mask 132, the dummy gate stack 124, the semiconductor fins 110 and/or the isolation structures 105, so as to further prevent them from unwanted damage caused by the etchant. Similarly, the helmet layer 142 has higher etch resistance to the etchant used to etch the spacer layer 160 than that of the first mask 131, second mask 132 the dummy gate stack 124, the semiconductor fins 110, and/or the isolation structures 105, so as to further prevent them from unwanted damage caused by the etchant. In some embodiments, a promising candidate of the doped portion 144A for achieving the demonstrated high etch resistance includes, for example, doped amorphous silicon. In some embodiments, a promising candidate of the helmet layer 142 for achieving the demonstrated high etch resistance includes, for example, a metal-containing material, such as metal, alloy or metal oxide. As a result, the helmet layer 142 can be equivalently referred to as a metal-containing layer, and the doped portion 144A can be equivalently referred to as a doped a-Si portion, in some embodiments.

In some embodiments, the etching process results in exposing the top surface of the second mask 132 above the dummy gate stack 124, and the top surfaces and sidewalls of the semiconductor fins 110. Stated another way, the dielectric material of the spacer layer 160 are removed from the top surfaces and sidewalls of the semiconductor fins 110, which in turn will be advantageous for epitaxially growing semiconductor material(s) from the exposed top surfaces and sidewalls of the semiconductor fins 110, as will be discussed in greater detail below.

As shown in FIGS. 9A and 9C, etching the spacer layer 160 may result in removing the first helmet layer 142 and the second helmet layer 144 under the gate spacers 161, such that a plurality of recesses $R_3$ and $R_4$ are formed between the gate spacers 161 and the underlying semiconductor fin 110, and between the gate spacers 161 and the underlying isolation structure 105, respectively. In some other embodiments, an additional etching process may be employed, after etching the spacer layer 160, to remove the first helmet layer 142 and the second helmet layer 144 under the gate spacers 161 to form the recesses $R_3$ and $R_4$. In some embodiments where the first helmet layer 142 is a metal or alloy layer, removal of the metal layer is advantageous for preventing unwanted electrical connections. In some embodiments where the first helmet layer 142 is a metal oxide layer, removal of the metal oxide layer is advantageous for alleviating resistive-capacitive delay.

As shown in FIG. 9A, the recesses $R_3$ are disposed at bottoms of portions of the gate spacers 161 above the semiconductor fin 110. In further embodiments, the portions of the gate spacers 161 above the semiconductor fin 110 each include a wide portion 161A and a narrow portion 161B below the wide portion 161A, in which the wide portion 161A and the narrow portion 161B define the recess $R_3$. Stated another way, the gate spacer 161 includes a stepped sidewall distant from the dummy gate stack 124.

As shown in FIG. 9C, the recesses $R_4$ are disposed at bottoms of portions of the gate spacers 161 over the isolation structures 105. In greater detail, the portions of the gate spacers 161 above the isolation structures 105 each include a wide portion 161C and a narrow portion 161D below the wide portion 161C, in which the wide portion 161C and the narrow portion 161D define the recess $R_4$.

The etching process used to etch the spacer layer 160 may include dry etching, wet etching, or combination thereof. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Reference is made to FIGS. 10A and 10B. Source/drain structures 180 are formed to wrap around the exposed semiconductor fins 110. That is, the top surfaces and opposite sidewalls of the semiconductor fins 110 are covered by the source/drain structures 180. In some embodiments, portions of the source/drain structures 180 fill the recesses $R_3$. In other words, the source/drains structures 180 are partially embedded in the gate spacers 161. State differently, portions of the source/drains structures 180 are in between the wide portions 161A of the gate spacers 161 and the semiconductor fin 110. In some embodiments, the interface between the gate spacer 161 and the semiconductor fin 110 is substantially level with the interface between the source/drain structure 180 and the semiconductor fin 110, as illustrated in FIG. 10A.

In some embodiments, the source/drain structures 180 are formed by using epitaxial growth, and thus may be referred to as epitaxy structures 180. In greater detail, the source/drain structures 180 may be formed using one or more epitaxy or epitaxial (epi) processes, such that Si features, SiGe features, and/or other suitable features can be formed in a crystalline state on the semiconductor fins 110. In some embodiments, lattice constants of the source/drain structures 180 are different from lattice constants of the semiconductor fins 110, such that channels in the semiconductor fins 110 are strained or stressed to enable carrier mobility of the semiconductor device and enhance the device performance. In some embodiments, the source/drain structures 180 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon). The source/drain structures 180 may be in-situ doped. The doping species include P-type dopants, such as boron or $BF_2$; N-type dopants, such as phosphorus or arsenic; and/or other suitable dopants including combinations thereof. If the source/drain structures 180 are not in-situ doped, a second implantation process (i.e., a junction implant process) is performed to dope the source/drain structures 180. One or more annealing processes may be performed to activate the source/drain structures 180. The annealing processes include rapid thermal annealing (RTA) and/or laser annealing processes.

Figure 11B:
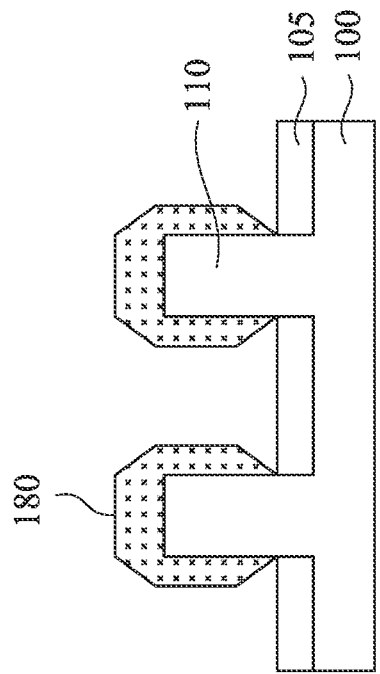
Figure 11A:
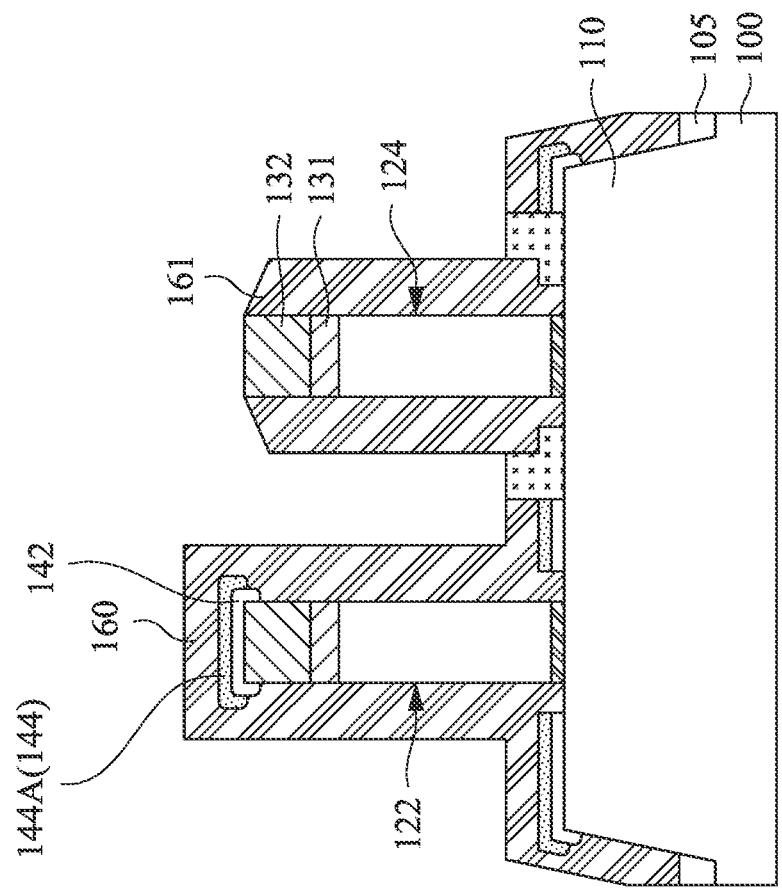

Reference is made to FIGS. 11A and 11B. The patterned mask 170 (referring to FIG. 10A) is removed. In some embodiments where the patterned mask 170 is photoresist, and may be removed by suitable process, such as stripping or ashing. As a result, the portion of the spacer layer 160 covering the dummy gate stack 122 is exposed.

Figure 12C:
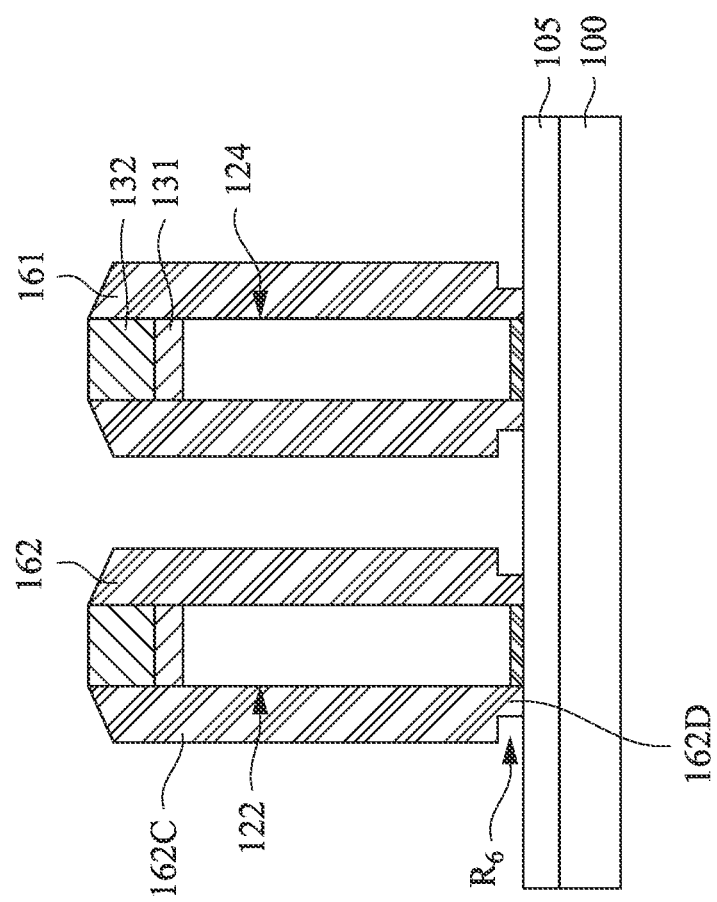

Reference is made to FIGS. 12A to 12C. An etching process is performed to remove portions of the spacer layer 160 around the dummy gate stacks 122. In some embodiments, the etching process is similar to that described in FIGS. 9A-9C. As a result, portions of the spacer layer 160 remain on opposite sidewalls of the dummy gate stack 124, and the remaining spacer layer 160 may also be referred to as gate spacers 162 in the following descriptions. In some embodiments, during the etching process, the first helmet layer 142 and the second helmet layer 144 (referring to FIG. 11A) above the dummy gate stack 124 are removed. In some embodiments, a patterned mask may be formed to protect the gate spacers 161, the second mask 132, and the source/drain structures 180 around the dummy gate stack 124 during the etching process, and may be removed after the etching process.

As shown in FIG. 12A, the etching process results in a plurality of recesses $R_5$ between the gate spacers 162 and the underlying semiconductor fin 110. Stated another way, portions of the gate spacers 162 above the semiconductor fin 110 each include a wide portion 162A and a narrow portion 162B below the wide portion 162A, and the wide portion 162A and the narrow portion 162B define the recess $R_5$.

As shown in FIG. 12C, the etching process also results in a plurality of recesses $R_6$ between the gate spacers 162 and the isolation structure 105. In greater detail, portions of the gate spacers 162 above the isolation structure 105 each include a wide portion 162C and a narrow portion 162D below the wide portion 162C, in which the wide portion 162C and the narrow portion 162D define the recess $R_6$.

Reference is made to FIGS. 13A to 13C. An interlayer dielectric (ILD) 190 is formed over the substrate 100 and at outer sides of the gate spacers 161 and 162. Accordingly, the interlayer dielectric 190 covers the source/drain structures 180 and portions of the semiconductor fins 110 of the substrate 100. The interlayer dielectric 190 may include silicon oxide, oxynitride or other suitable materials. The interlayer dielectric 190 includes a single layer or multiple layers. The interlayer dielectric 190 can be formed by a suitable technique, such as CVD or ALD. A chemical mechanical polishing (CMP) process may be performed to remove interlayer dielectric 190 until reaching the dummy gate stacks 122 and 124. After the chemical mechanical planarization (CMP) process, the dummy gate stacks 122 and 124 are exposed from the interlayer dielectric 190. In some embodiments, a contact etch stop layer (CESL) may be blanket formed over the substrate 100 prior to the formation of the interlayer dielectric 190.

In FIG. 13A, portions of the interlayer dielectric 190 fill the recesses $R_5$ of the gate spacers 162. In other words, portions of the interlayer dielectric 190 are embedded in the gate spacers 162, and are in between the gate spacers 162 and the semiconductor fin 110.

As shown in FIG. 13C, portions of the interlayer dielectric 190 fill the recesses $R_4$ of the gate spacers 161 and recess $R_6$ of the gate spacers 162. In other words, portions of the interlayer dielectric 190 are embedded in the gate spacers 161 and 162, and are in between the gate spacer 161 and the semiconductor fin 110, and in between the gate spacer 162 and the semiconductor fin 110, respectively.

Figure 14C:
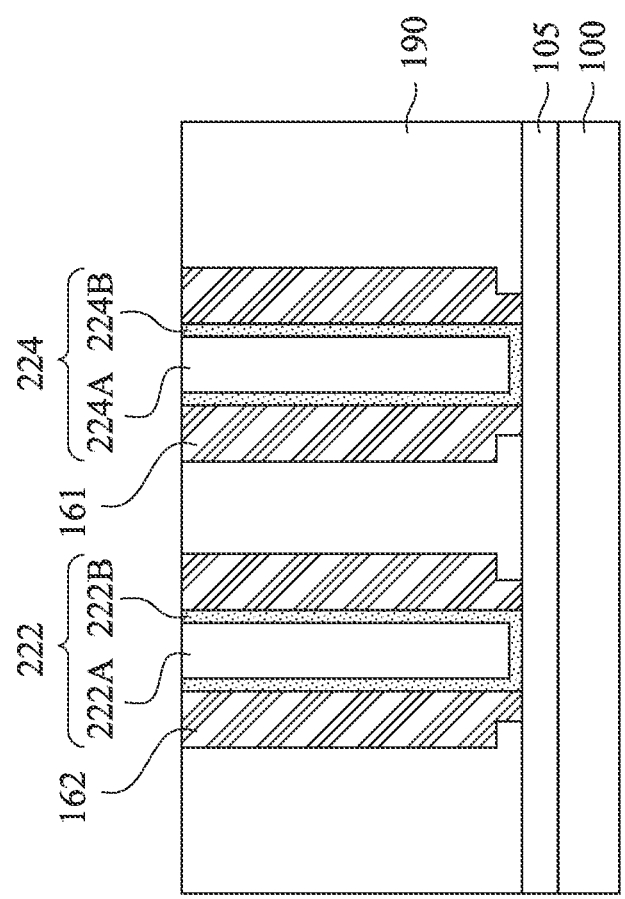

Reference is made to FIGS. 14A to 14C. A replacement gate (RPG) process scheme is employed. The dummy gate stacks 122 and 124 are replaced with gate stacks 222 and 224, respectively. For example, the dummy gate stacks 122 and 124 (see FIGS. 13A and 13B) are removed to from a plurality of gate trenches. The dummy gate stacks 122 and 124 are removed by a selective etch process, including a selective wet etch or a selective dry etch, and carries a substantially vertical profile of the gate spacers 161 and 162. The gate trenches expose portions of the semiconductor fins 110 of the substrate 100. Then, the gate stacks 222 and 224 are formed respectively in the gate trenches and cover the semiconductor fins 110 of the substrate 100. In some embodiments, the top surfaces of the gate stacks 222 and 224 are substantially level with the interlayer dielectric 190. In some embodiments, the gate stack 222 is a non-functional gate because there is no source/drain on opposite sides of the gate stack 222.

The gate stacks 222 and 224 include an interfacial layer (not shown), gate dielectrics 222B and 224B formed over the interfacial layer, and gate metals 222A and 224A formed over the gate dielectrics 222B and 224B. The gate dielectrics 222B and 224B, as used and described herein, include dielectric materials having a high dielectric constant, for example, greater than that of thermal silicon oxide (~3.9). The gate metals 222A and 224A may include a metal, metal alloy, and/or metal silicide.

In some embodiments, the gate metals 222A and 224A included in the gate stacks 222 and 224 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 222A and 224A may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectrics 222B and 224B may include a high-K dielectric layer such as hafnium oxide ($HfO_2$). Alternatively, the gate dielectric 212 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 222B and 224B may be formed by ALD, PVD, CVD, oxidation, and/or other suitable methods.

According to the aforementioned embodiments, it can be seen that the present disclosure offers advantages over FinFET devices. It is understood, however, that other embodiments may offer additional advantages, and not all advantages are necessarily disclosed herein, and that no particular advantage is required for all embodiments. One advantage is that a helmet layer is formed over dummy gate stacks, semiconductor fins and isolation structures prior to a fin sidewall pull back process (i.e., removal of the spacer layer from sidewalls of the fin), and hence the helmet layer can prevent the dummy gate stacks, the semiconductor fins and the isolation structures from unwanted damage caused by the fin sidewall pull back process. As such, the fin sidewall pull back process can result in reduced height loss of the dummy gate stacks, the semiconductor fins and the isolation structures.

In some embodiments of the present disclosure, a method includes forming a semiconductor fin over a substrate; forming a gate structure over the semiconductor fin; forming a helmet layer lining the gate structure and the semiconductor fin; etching the helmet layer to remove portions of the helmet layer from opposite sidewalls of the gate structure, wherein the remaining helmet layer comprises a first remaining portion on a top surface of the gate structure and a second remaining portion on a top surface of the semiconductor fin; forming a spacer layer covering the gate structure, wherein the spacer layer is in contact with the first remaining portion and the second remaining portion of the remaining helmet layer; etching the spacer layer and the remaining helmet layer to form gate spacers on opposite sidewalls of the gate structure, wherein each of the gate spacers has a stepped sidewall; and forming source/drain epitaxy structures over the semiconductor fin and on opposite sides of the gate structure.

In some embodiments of the present disclosure, a method includes forming a semiconductor fin over a substrate; forming a gate structure over the semiconductor fin; forming a metal-containing layer lining the semiconductor fin; forming a silicon layer over the metal-containing layer; performing an implantation process to form dope regions in horizontal portions of the silicon layer, while leaving vertical portions of the silicon layer un-doped; etching the vertical portions of the silicon layer and vertical portions of the metal-containing layer to expose sidewalls of the semiconductor fin; forming gate spacers on opposite sidewalls of the gate structure; removing the silicon layer and the metal-containing layer to expose the semiconductor fin; and forming source/drain epitaxy structures over the semiconductor fin and on opposite sides of the gate structure.

In some embodiments of the present disclosure, a method includes forming a semiconductor fin over a substrate; forming a gate structure over the semiconductor fin and the STI structure; forming a helmet layer covering the gate structure and the semiconductor fin; removing vertical portions of the helmet layer to expose sidewalls of the gate structure, while leaving horizontal portions of the helmet layer covering a top surface of the semiconductor fin; forming gate spacers on opposite sidewalls of the gate structure, wherein each of the gate spacers has a wider portion and a narrower portion below the wider portion, the narrower portion having a smaller width than the wider portion; removing the helmet layer to expose the top surface of the semiconductor fin; and forming source/drain epitaxy structures over the semiconductor fin and on opposite sides of the gate structure, wherein each of the source/drain epitaxy structures has a portion vertically between the wider portion of a corresponding one of the gate spacers and the top surface of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor fin over a substrate;
forming a gate structure over the semiconductor fin;
forming a helmet layer lining the gate structure and the semiconductor fin;
etching the helmet layer to remove portions of the helmet layer from opposite sidewalls of the gate structure, wherein the remaining helmet layer comprises a first remaining portion on a top surface of the gate structure and a second remaining portion on a top surface of the semiconductor fin;
forming a spacer layer covering the gate structure, wherein the spacer layer is in contact with the first remaining portion and the second remaining portion of the remaining helmet layer;
etching the spacer layer and the remaining helmet layer to form gate spacers on opposite sidewalls of the gate structure, wherein each of the gate spacers has a stepped sidewall; and
forming source/drain epitaxy structures over the semiconductor fin and on opposite sides of the gate structure.

2. The method of claim 1, wherein forming the helmet layer comprises:
forming a metal-containing layer lining the gate structure and the semiconductor fin; and
forming a silicon layer over the metal-containing layer.

3. The method of claim 2, further comprising doping the silicon layer to form doped regions in the silicon layer, wherein etching the helmet layer is performed to remove un-doped regions of the silicon layer and first portions of the metal-containing layer covered by the un-doped regions of the silicon layer, and wherein second portions of the metal-containing layer are protected by the doped regions of the silicon layer during etching the helmet layer.

4. The method of claim 1, wherein one of the source/drain epitaxy structures is in contact with the stepped sidewall of a corresponding one of the gate spacers.

5. The method of claim 1, further comprising forming a hard mask over the gate structure, wherein the helmet layer is in contact with a top surface of the hard mask.

6. The method of claim 5, wherein etching the spacer layer and the remaining helmet layer is performed to expose the top surface of the hard mask.

7. The method of claim 1, wherein the spacer layer is in contact with a first portion of the semiconductor fin, and is separated from a second portion of the semiconductor fin by the second remaining portion of the remaining helmet layer.

8. A method, comprising:
forming a semiconductor fin over a substrate;
forming a gate structure over the semiconductor fin;
forming a metal-containing layer lining the semiconductor fin;
forming a silicon layer over the metal-containing layer;
performing an implantation process to form doped regions in horizontal portions of the silicon layer, while leaving vertical portions of the silicon layer un-doped;
etching the vertical portions of the silicon layer and vertical portions of the metal-containing layer to expose sidewalls of the semiconductor fin;
forming gate spacers on opposite sidewalls of the gate structure;
removing the silicon layer and the metal-containing layer to expose the semiconductor fin; and forming source/drain epitaxy structures over the semiconductor fin and on opposite sides of the gate structure.

9. The method of claim 8, wherein forming gate spacers comprises:
    forming a spacer layer covering the gate structure, wherein the spacer layer is vertically separated from the semiconductor fin at least in part by the horizontal portions of the silicon layer; and
    etching the spacer layer.

10. The method of claim 8, wherein each of the gate spacers has a wider portion and a narrower portion under the wider portion, the narrower portion having a smaller width than the wider portion.

11. The method of claim 10, wherein one of the source/drain epitaxy structures is in contact with the narrower portion of a corresponding one of the gate spacers.

12. The method of claim 8, further comprising forming isolation structures laterally surrounding the semiconductor fin, wherein the metal-containing layer is formed lining the isolation structures.

13. The method of claim 12, wherein etching the vertical portions of the silicon layer and the vertical portions of the metal-containing layer is performed to expose portions of the isolation structures.

14. The method of claim 8, wherein the metal-containing layer also lines the gate structure, and etching the vertical portions of the silicon layer and the vertical portions of the metal-containing layer is performed to expose sidewalls of the gate structure.

15. A method, comprising:
    forming a semiconductor fin over a substrate;
    forming a shallow trench isolation (STI) structure over the substrate and adjacent to the semiconductor fin;
    forming a gate structure over the semiconductor fin and the STI structure;
    forming a helmet layer covering the gate structure and the semiconductor fin;
    removing vertical portions of the helmet layer to expose sidewalls of the gate structure, while leaving horizontal portions of the helmet layer covering a top surface of the semiconductor fin;
    forming gate spacers on opposite sidewalls of the gate structure, wherein each of the gate spacers has a wider portion and a narrower portion below the wider portion, the narrower portion having a smaller width than the wider portion;
    removing the helmet layer to expose the top surface of the semiconductor fin; and
    forming source/drain epitaxy structures over the semiconductor fin and on opposite sides of the gate structure, wherein each of the source/drain epitaxy structures has a portion vertically between the wider portion of a corresponding one of the gate spacers and the top surface of the semiconductor fin.

16. The method of claim 15, wherein forming the helmet layer comprises:
    forming a first layer lining the gate structure and the semiconductor fin; and
    forming a second layer over the first layer.

17. The method of claim 16, wherein removing vertical portions of the helmet layer comprises:
    performing an implantation process to form doped regions in horizontal portions of the second layer, while leaving vertical portions of the second layer un-doped; and
    performing an etching process to remove the vertical portions of the second layer and vertical portions of the first layer, while the horizontal portions of the second layer protect horizontal portions of the first layer during the etching process.

18. The method of claim 16, wherein the first layer is a metal-containing layer, and the second layer is a silicon layer.

19. The method of claim 15, wherein a portion of the top surface of the semiconductor fin is exposed as a result of removing the vertical portions of the helmet layer.

20. The method of claim 15, wherein the helmet layer is in contact with the STI structure.

* * * * *